United States Patent [19]

Fossum et al.

[11] Patent Number: 4,920,069
[45] Date of Patent: Apr. 24, 1990

[54] SUBMICRON DIMENSION COMPOUND SEMICONDUCTOR FABRICATION USING THERMAL ETCHING

[75] Inventors: Eric R. Fossum, Yorktown Heights; Peter D. Kirchner, Garrison; George D. Pettit, Mahopac; Alan C. Warren, Peekskill; Jerry M. Woodall, Bedford Hills, all of N.Y.

[73] Assignee: International Business Machines Corporation, Armonk, N.Y.

[21] Appl. No.: 183,489

[22] Filed: Apr. 15, 1988

Related U.S. Application Data

[63] Continuation of Ser. No. 12,463, Feb. 9, 1987, abandoned.

[51] Int. Cl.[5] .............................................. H01L 21/20
[52] U.S. Cl. ............................. 437/90; 148/DIG. 17; 148/DIG. 50; 148/DIG. 65; 148/DIG. 135; 148/DIG. 169; 156/610; 437/78; 437/107; 437/133; 437/228; 437/974; 437/947
[58] Field of Search .................. 148/DIG. 17, 25, 50, 148/51, 56, 65, 72, 110, 135, 168, 169; 156/610–615; 357/55, 56; 437/78, 81, 82, 89, 90, 105, 107, 108, 126, 133, 228, 936, 939, 943, 945, 946, 976, 974, 947; 427/248.1, 255.1, 252

[56] References Cited

U.S. PATENT DOCUMENTS

| | | | |
|---|---|---|---|
| 3,915,765 | 10/1975 | Cho et al. | 156/610 |
| 3,969,164 | 7/1976 | Cho et al. | 437/107 |
| 3,992,233 | 11/1976 | Farrow | 156/612 |
| 4,371,968 | 2/1983 | Trussell, Jr. et al. | 437/107 |
| 4,589,192 | 5/1986 | Dinan et al. | 437/107 |
| 4,637,129 | 1/1987 | Derkits, Jr. et al. | 437/107 |
| 4,644,381 | 2/1987 | Shieh | 357/35 |

Primary Examiner—Brian E. Hearn
Assistant Examiner—William Bunch
Attorney, Agent, or Firm—Thomas J. Kilgannon, Jr.

[57] ABSTRACT

Submicron structure fabrication is accomplished by providing vapor chemical erosion of a compound crystal by suppressing the more volatile elements so that the less volatile element is provided with an anti-agglomeration and erosion rate limiting capability which can be followed by subsequent regrowth in the same environment. The erosion is sensitive to crystallographic orientation.

12 Claims, 3 Drawing Sheets

SUBMICRON DIMENSION COMPOUND SEMICONDUCTOR FABRICATION USING THERMAL ETCHING

This application is a continuation of application Ser. No. 07/012,463 filed Feb. 9,1987, now abandoned.

Technical Field

The technical field of the invention is in the formation of very small dimension semiconductor structures in compound-type semiconductor materials. The more well-known of these materials are composed of elements from Group III and Group V of the periodic table such as gallium arsenide.

When the constantly decreasing dimensions of this type of semiconductor structure become in the submicron range, the electrical and optical properties become more and more influenced by the properties of the surfaces and interfaces which surround the structure. The conventional fabrication techniques result in surfaces that are either contaminated by residue from the fabrication operations or the crystal is damaged, each being a severe detriment when the device is that small.

BACKGROUND ART

Indirect dimensioning techniques are generally employed to produce submicron dimension type devices. One example of this type of technology is U.S. Pat. No. 4,587,709 involving angular evaporation and etching, and another example is U.S. Pat. No. 4,532,698 involving angular deposition and ion implantation.

DESCRIPTION OF THE INVENTION

Figure 1:
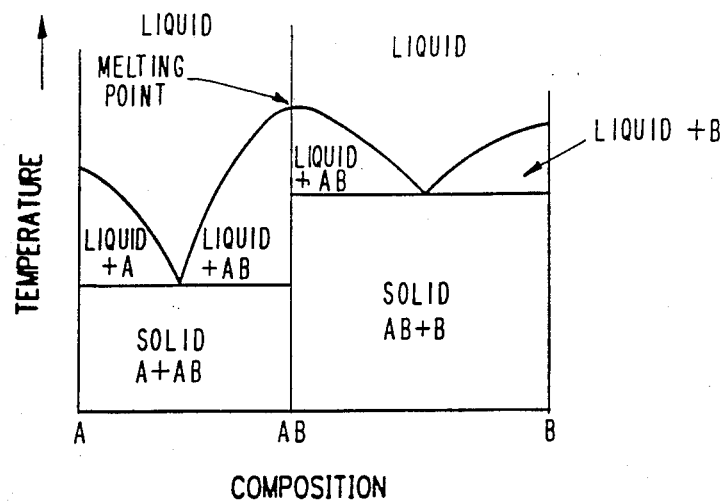
FIG. 1 is a schematic phase diagram for the type of compound semiconductor that is vapor chemically erodible.

In accordance with the invention through the selection of processing and environmental conditions together with crystallographic orientation, a certain type of compound semiconductor crystal can in a constant uncontaminating environment be vapor chemically eroded with subsequent regrowth of either the same or other material, as desired, to produce devices with submicron dimensions under minimum thermal, surface, crystal stress and damage conditions.

The vapor chemical erosion operates to remove device dimension quantities of the compound semiconductor crystal, in a non-damaging operation resembling sublimation, that progresses at different rates in accordance with crystallographic orientation and which can be regrown to planar in minimum thickness in the same environment.

The type of compound semiconductor material has two or more elements where one element of the compound has a vapor pressure that is higher than the vapor pressures of the other ingredients yet each ingredient has a different melting temperature that is lower than the melting temperature of the combined ingredients. The rate of erosion is then limited by the evaporation rate of the lowest volatility element, at a given temperature. For example, gallium for gallium arsenide. Compound semiconductor crystals of GaAs, InP, AlAs, InAs, GaP, AlP and alloys of these binary compounds, such as GaInAsP satisfy these requirements and in contrast ZnSe does not. A compound semiconductor crystal of this type, in the presence of a suppressing capability for the more volatile elements permits localized portions of the crystal to be eroded in a high vacuum uncontaminating environment and then be followed by regrowth as desired in the same controlled environment. The suppressing capability for the more volatile elements prevents agglomeration of the lower volatility element and permits precise erosion. The erosion is performed with the minimum energy being the thermal energy sufficient to remove atoms from the eroding surface yet bulk crystal damage does not occur. The suppressing capability is achieved using sufficient overpressure of the more volatile ingredients. The overpressure is in a range sufficient to prevent agglomeration of the lower volatility elements on the surface and the maximum value being sufficient to radically suppress removal.

Total prevention of the erosion process may be achieved by covering the surface where desired by a masking agent that is thermally and chemically stable at the erosion temperature.

In accordance with the invention, the crystal is masked and supplied with energy, usually as heat. The temperature employed will be sufficient to provide a sufficient number of the surface atoms of the lower volatility element with energy greater than the binding energy and hence to cause evaporation, while the pressure over the higher volatility ingredients operates to prevent agglomeration or combination into droplets of the lower volatility element. Regrowth as desired in the same vacuum environment is readily accomplished by the molecular beam epitaxy technique.

In the structure under fabrication, materials changes and crystallographic direction can be employed to provide higher binding energy situations at the eroding crystal face that serve an erosion stopping function.

In order to establish perspective, the following discussion is directed to the types of detrimental aspects encountered with the fabrication techniques currently in use.

Non-erosion lateral definition of device structures in compound semiconductors is routinely performed by patterned doping to confine carriers electrically to specific areas of the material or by patterned amorphization using ion implantation to render certain areas of the material electrically inactive. Alternatively, etching is usable to physically confine the carriers.

While the techniques of patterned doping and ion implantation yield areas whose edges are of good electrical quality, these techniques produce relatively imprecise or soft boundaries due to lateral diffusion of the doping or amorphizing ions during the patterning process. Such boundaries are particularly detrimental when making ultrasmall device structures with dimensions of less than 1 micron.

The use of etching offers the potential of extension to the very small submicron dimension types of structures because of the abrupt nature of the boundaries produced, but this technique also has a generic disadvantage of relatively poor lateral surfaces resulting from the limits of conventional patterning techniques.

Both damage and contamination of compound semiconductor surfaces are important, and since air-exposure of any surface results in contamination of that surface, connecting the processes of etching the semiconductor material with protecting the resulting surface by subsequent material regrowth will produce a structure where the effect of a normal environment is not detrimental. Under these conditions, the quality of any etched and/or regrown interface then becomes of critical importance.

The various conventional methods for etching compound semiconductor materials may be conveniently grouped into two types for discussion: wet-etching techniques and dry-etching techniques. Both involve a prior lithographic patterning of a mask, followed by selective removal of unprotected portions of the crystal.

The general technique of wet-etching of semiconductor materials by chemical means involves a relatively low-energy process of breaking bonds at the material surface and thus does not damage the crystal below the exposed surface. However, the technique does require that the resulting surface be exposed to both the chemicals employed in the etching and to whatever ambient, whether air or inert gas, that the etching is performed within. The residues from the chemicals or ambient contaminates the resulting patterned surface and the contaminant is then traped at any interface produced by subsequent regrowth. At sufficiently high levels of contamination, the Fermi level of the semiconductor becomes pinned at that interface rendering the material region in close proximity electrically inactive. At lower levels of contamination, the electronic mobility is reduced and increased carrier trapping occurs. Either is a severe problem for semiconductor device structures with active areas having dimensions below 1 micron.

There are several conventional dry-etching techniques that lead to lower contamination levels than wet-etching techniques, but these tend to produce surfaces with considerable levels of crystalline damage over an extended depth.

The technique of Reactive Ion Etching (RIE) can be performed in a closed chamber with subsequent epitaxial regrowth by connecting the chamber in which the RIE is performed to a Molecular Beam Epitaxy (MBE) system through a vacuum transfer. Thus, while RIE is not an Ultra-High-Vacuum (UHV) process, it may be performed in a sufficiently low-vacuum that the degree of contamination of the patterned semiconductor surface could be significantly reduced over that from wet-etching processes. However, RIE involves the energetic bombardment of the crystal surface using typically 100 to 2000 electron volts to produce the etching, which results in significant crystal point defects and dislocation crystal damage over a depth of several hundred angstroms beneath the crystal surface. This results in sufficiently poor electrical quality of the semiconductor material as to prevent use in submicron devices.

The technique of ion milling is performed in a higher vacuum and is thereby cleaner. It can be performed in a closed chamber so as to produce extremely contamination-free surfaces for subsequent regrowth, but unfortunately the technique involves even higher energies and hence crystal damage, than the RIE process. Thus, while lateral surfaces and interfaces including regrowth may be produced having extremely low levels of contamination, the degree and spatial extent of the resulting crystal damage is typically greater than that of Reactive Ion Etching, again producing severe problems for semiconductor devices with submicron active areas.

The technique of Laser Induced Etching (LIE) is a more contamination-prone process, but has an advantage in that it requires lower energies and so produces less extensive crystalline damage. A reactive gas ambient at less than atmospheric pressures is employed with the necessary energy provided through an incident laser flux. This energy is typically of several electron volts and is sufficient to produce point defects near the surface. The point defect damage can be largely annealed out of the semiconductor crystal. Lateral interfaces, however, are poorly defined since this process is largely isotropic.

In the light of the limitations in the techniques at the present state of the art, an optimum patterning technique for submicron applications would be to provide dry-etching with ultra-high-vacuum compatibility yet using a low energy, preferably less than 1 electron volt, in an etching operation that is anisotropic so as to produce well-defined horizontal and lateral surfaces.

While the invention will be described in connection with the more extensively studied semiconductor material GaAs, it will be apparent to one skilled in the art that the principles involved can be readily translated to other materials.

Referring to FIG. 1, a phase diagram of temperature, composition, and the liquid solid equilibrium for a binary compound semiconductor AB is shown. Considering A to be Ga and B to be As with the composition AB being GaAs, there is a higher melting point for As than for Ga and the highest melting point would be that of the compound.

Figure 2:
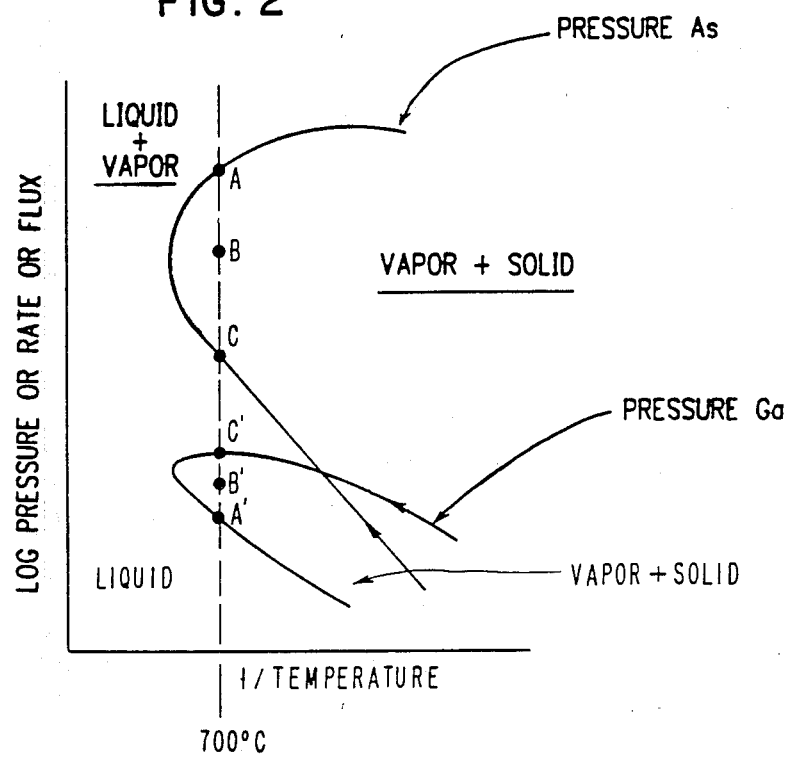
FIG. 2 is another schematic phase diagram of a compound semiconductor in which the lines show the interrelationship between vapor pressure and temperature at solid-liquid-vapor equilibrium.

Referring next to FIG. 2, a related phase diagram is provided showing the interrelationship between pressures of the component elements of the compound and how evaporation rates are limited by those pressures. The lines in FIG. 2 represent the pressure temperature relationship of the component elements with the solid compound when the system is at three phase—liquid, vapor, solid—equilibrium. In the GaAs example, one line is for Ga and the other is for As. Taking an example temperature such as 700° C. for GaAs as shown dotted, there will be a range of higher volatility element (HVE) (As) overpressures ABC, which correspond with a set of lower volatility element (LVE) (Ga) overpressures A'B'C'. The desired operating suppression capability pressure lies between, but not including, points A and C shown illustratively as B for the example temperature.

Figure 3:
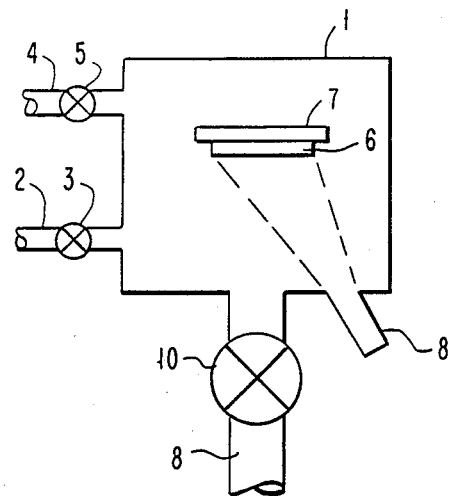
FIG. 3 is a schematic illustration of a vapor chemical erosion chamber.

Referring next to FIG. 3, a schematic illustration is provided of the apparatus chamber requirements for providing the vapor chemical erosion of the invention. In FIG. 2, a chamber 1 is brought down to a high vacuum of $10^{-9}$ or lower Torr by rough pumping to about $10^{-5}$ Torr through a port 2 and valve 3 and then further pumped down to $10^{-9}$ Torr or lower through a port 4 and valve 5. A vapor chemical erodible crystal 6 is positioned on a heating member 7. Particular element volatility suppression means is provided for controlling the volatility of the higher volatility ingredients. This means is illustrated as a molecular beam 8 of the type used in molecular beam epitaxy capable of introducing controllably an overpressure of the desired element of the compound is a narrow range sufficiently high to prevent agglomeration of the atoms of the ingredient on the surface of the crystal 6 yet low enough to permit the lower volatility atoms to escape so that there is no build-up at the surface of the crystal and hence the erosion can proceed smoothly. Crystal insertion and removal means is shown as a port 9 with valve 10.

Figure 4:
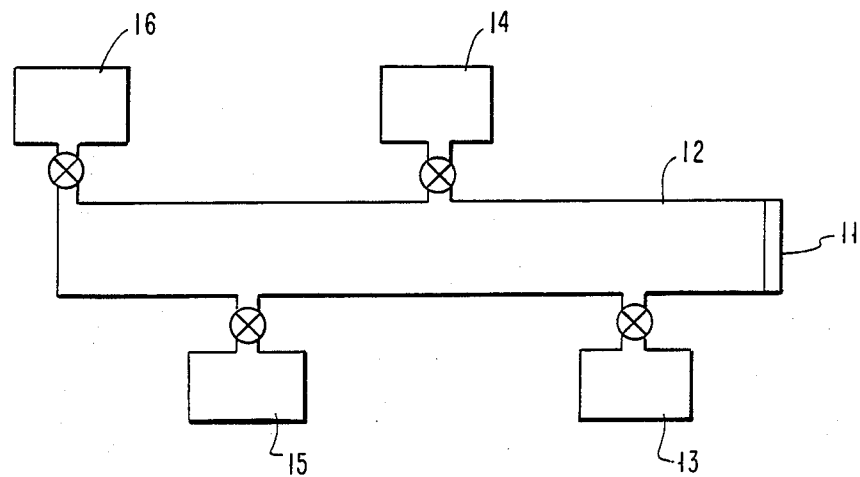
FIG. 4 is a schematic view of an apparatus that provides the functions for semiconductor structures produced in a constant environment using vapor chemical erosion and regrowth.

Referring next to FIG. 4, a schematic apparatus is illustrated capable of permitting the several fabrication operations with complete flexibility between them all within a controlled environment.

In order to avoid contamination of the eroded surface, a rigidly controlled environment is required while performing and moving between operations. This requirement is satisfied by performing all operations within the same vacuum apparatus.

In FIG. 4, the apparatus is provided with a centralized load-lock chamber 11 at one end of a central corridor 12 for the introduction and transport of the semiconductor crystal from operating site to operating site without breaking the vacuum. Element 13 is a standard molecular beam epitaxy chamber. Element 14 is a deposition chamber for such operations as applying masks, resists, contacts and conductors. Element 15 is a reactive ion etching (RIE) chamber which, even though some damage is introduced, is useful with particularly impervious masking materials. Element 16 is a vapor chemical erosion chamber of the type discussed in connection with FIG. 3. All elements 13, 14, 15 and 16 are connected to the central corridor 12 so that workpieces in semiconductor fabrication can be moved to selected operating sites 13-16 in repetitive selection without breaking vacuum.

Figure 5:
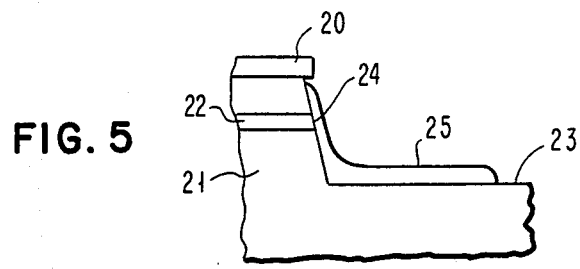
FIG. 5 is a cross-sectional illustration of a multilayer structure illustrating intersecting crystallographic plane surfaces.

Referring next to FIG. 5, there is shown a cross sectional structure in accordance with the invention having crystal planes and regrowth formed by the vapor chemical erosion of the invention. In FIG. 5, a silicon nitride or other relatively impervious mask 20 was deposited in a pattern on the original surface of the vapor erodible compound crystal 21 in the deposition chamber 14. The crystal 21 had been grown by molecular beam epitaxy in chamber 13 to include a layer 22, having a different conductivity type or mobility, useful for future devices. The structure, as shown in FIG. 5, was subjected to the vapor chemical erosion process in chamber 16 which for the GaAs illustration proceeds rapidly along the 100 crystallographic plane orientation of the surface 23 while simultaneously on surface 24 in the lateral direction since the 011 or 111 crystallographic plane is involved the rate will be less and the surface 24 can undercut the mask 20 and may be off verticality with respect to surface 23.

The relative differences in erosion progress in a given time for surfaces 23 and 24 are submicron dimension distances and the crystal quality of the surfaces 23 and 24 are of such perfection that a regrown region 25 can be provided in the same vacuum in chamber 13, which regrown region 25 in turn can be provided with any device properties desirable in the art.

Referring next to FIGS. 6, 7, 8 and 9, illustrations are provided of the steps and final structure in the fabrication of a field effect type transistor in accordance with the invention.

Figure 6:
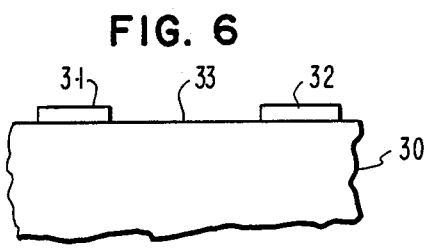
FIGS. 6, 7, 8 and 9 are schematic illustrations of masked erosion and regrowth device progress in producing a field effect transistor in accordance with the invention.

Referring to FIG. 6, a GaAs crystal 30 is provided with a vapor chemical erosion resistant mask deposited in a pattern as areas 31 and 32 of, for example, silicon nitride. The exposed surface 33 of the GaAs crystal is selected for rapid erosion to be the 100 crystallographic plane.

Figure 7:
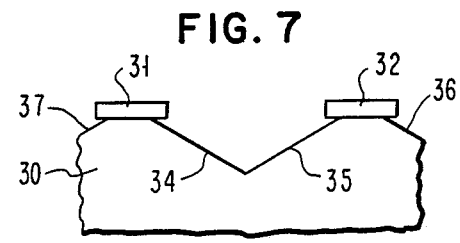

Referring next to FIG. 7, the vapor chemical erosion of the crystal 30 is illustrated as having proceeded vertically in the 100 plane direction and laterally under the edges of the mask elements 31 and 32 until the only plane that is exposed is the 111 plane on surfaces 34 and 35. This plane has a higher atom binding energy and the erosion stops. On the other side of the mask elements 31 and 32 the 111 planes 36 and 37 are illustrated.

Figure 8:
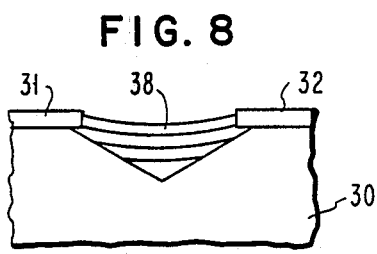

Referring next to FIG. 8, the crystal 30 is then subjected to a regrowth. Without disturbing the environment by retaining it in the vacuum, a molecular beam epitaxial growth 38 is performed on the surfaces 34 and 35.

The semiconductor regrown region 38 epitaxially grows on surfaces 34 and 35 and in essence fills the eroded portion between the two masks 31 and 32. The lines in the region 38 are schematically drawn to illustrate layers of 100 crystallographic orientation that occur as the region 38 fills the opening.

Figure 9:
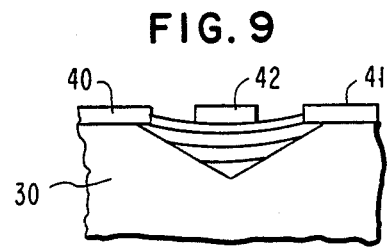

Referring next to FIG. 9, the structure of FIG. 8 is provided with circuit electrodes for use as a field effect transistor. The masks 31 and 32 have been removed and replaced with metal contacts 40 and 41 which serve as source and drain electrodes for a field effect transistor employing as a channel the portion of the region 38 adjacent the surface and a gate electrode 42 is positioned thereon.

Figure 10:
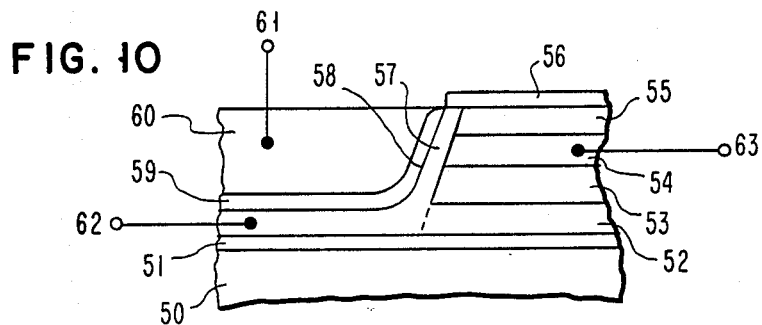
FIG. 10 is a schematic illustration of a lateral heterojunction bipolar transistor produced in accordance with the invention.

The technique of the invention provides unlimited structural flexibility as is illustrated in connection with FIG. 10 showing a schematic illustration of a lateral heterojunction bipolar transistor. In the structure of FIG. 10 on a substrate 50 which in turn may be a buffer layer of an even larger substrate on a high vapor chemical erosion plane surface such as 100, an isolation layer 51 was provided of a crystallographically compatible generally higher bandgap material such as GaAlAs, which would have a higher binding energy and hence would stop vapor chemical erosion. The original crystal would have been made up of a series of layers 52 of p+ conductivity type, 53 of semi-insulating material, 54 of n+ conductivity type, and 55 of semi-insulating material. Over the layer 55, a vapor chemical erosion mask 56 would have been positioned by patterning and vapor chemical erosion would have been employed to erode the crystal away to the slanting interface 57 which is undercut with respect to mask 56. For ease of illustration, the interface 57 is extended dotted to the erosion stop layer 51 although on regrowth the dotted portion of the interface 57 disappears. Regrowth is then employed producing the interface 58. Since the portion that was layer 52 and this regrown region including the portion between interfaces 57 and 58 will be the base of a transistor, the regrowth conditions are selected to provide appropriate doping. Subsequently further regrowth in the regions 59 and 60 provide the desired emitter doping levels. The resulting structure would have the layer 52 of p+ conductivity serve as the base region contact and the region between interfaces 57 and 58 in the vicinity of the layer 54 which serves as the collector would be the base.

The emitter width is determined by the n+ emitter layer 54 thickness, a very controllable dimension for submicron type devices, and the base thickness would be then equal to the distance between interfaces 57 and 58, again an easily submicron controllable dimension.

Electrical contacts to the collector 61, the base 62 and the emitter 63 are provided for circuit interfacing.

It will thus be apparent to one skilled in the art that the invention provides the capability of producing a variety of submicron dimension structures completely free of crystal and environment exposure damage and without the necessity of using submicron resolution lithographic techniques.

BEST MODE FOR CARRYING OUT THE INVENTION

In the structure of FIG. 9, a 100 crystallographic oriented surface GaAs wafer is masked with a 50 nanometer thick layer of tungsten silicide which is then patterned to open a 1 micron hole for the regrown channel and gate region. The structure is then heated for 1 hour at 715° C., which is equivalent to 0.1 eV, with an arsenic overpressure flux with an equivalent pressure of $3.5 \times 10^{-6}$ Torr for preferred operation although variation as far as $10 \times 10^{-5}$ is tolerable. This produces the v-grooved channel which terminates at the 111 crystallographic plane as illustrated in FIG. 7 and are of the order of 0.7 microns deep.

The structure was then subjected to regrowth as in FIG. 8 at 600° C. and regrowth of about 1 micron per hour occurs. Where 111 planes are exposed and the regrowth temperature is sufficiently high, the regrowth preferentially follows 100 planes.

The masks are replaced with ohmic contacts and a gate contact is provided on the regrown region.

What has been described is a technique of fabricating submicron structures wherein conditions are set up for vapor chemical erosion of a compound crystal by suppressing the more volatile elements so that the less volatile element is provided with an anti-agglomeration and erosion rate limiting capability which can be followed by subsequent regrowth in the same environment.

Having thus described our invention, what we claim as new and desire to secure by letters patent is:

1. A method for fabricating semiconductor devices comprising the steps of:
   providing a compound semiconductor substrate the surface of which has a given crystallographic orientation,
   aligning mask portions on the surface of said substrate such that their edges are aligned in a direction parallel to the line of intersection of intersecting planes obtained by the more rapid erosion of said substrate in the vertical direction than in the lateral direction and such that portions of said surface are exposed, and,
   anisotropically etching said exposed surface portions by vapor chemical erosion such that at least a portion of each of said planes is exposed to form at least a portion of a v-grooved channel.

2. The method according to claim 1 wherein said compound semiconductor is a member selected from the group of GaAs, InP, AlAs, InAs, GaP, AlP and alloys thereof.

3. A method according to claim 1 further including the step of:
   regrowing at least an epitaxial layer of semiconductor material in said at least a portion of a v-grooved channel
   said at least a layer having said given crystallographic orientation.

4. A method according to claim 1 wherein said given crystallographic orientation is a 100 crystallographic orientation.

5. A method according to claim 1 wherein said intersecting planes are 111 crystallographic planes and said line of intersection is oriented in a 110 direction.

6. A method according to claim 1 wherein said intersecting planes are 110 crystallographic planes and said line of intersection is oriented in a 100 direction.

7. A method according to claim 1 wherein the step of anisotropically etching by thermal erosion is carried out in an overpressure of the highest volatility ingredient of said compound semiconductor.

8. A method according to claim 1 wherein said etching step by vapor chemical erosion is carried out at a temperature of 715° C. for one hour at an overpressure of the highest volatility ingredient of said compound semiconductor and wherein the latter is GaAs.

9. A method according to claim 1 further including the step of:
   providing a layer of etch-stop material under said substrate prior to said etching step such that etching terminates at said etch-stop material.

10. A method according to claim 3 wherein said semiconductor material is a compound semiconductor material.

11. A method according to claim 3 wherein said at least an epitaxial layer of semiconductor material regrows as a layer having a 100 crystallographic orientation.

12. A method according to claim 10 wherein said compound semiconductor material is one selected from the group consisting of GaAs, InP, AlAs, InAs, GaP, AlP and alloys thereof.

* * * * *